(12) United States Patent
Chou et al.

(10) Patent No.: US 8,624,616 B2
(45) Date of Patent: Jan. 7, 2014

(54) SUSPENDED IO TRACE DESIGN FOR SSP CANTILEVER DATA READ / WRITE

(75) Inventors: Tsung-Kuan Allen Chou, San Jose, CA (US); David Harrar, II, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/165,656

(22) Filed: Jul. 1, 2008

(65) Prior Publication Data

US 2013/0141131 A1 Jun. 6, 2013

(51) Int. Cl.
 *G01R 1/067* (2006.01)
 *G01R 3/00* (2006.01)
(52) U.S. Cl.
 USPC ................................ 324/755.07; 324/755.01
(58) Field of Classification Search
 USPC .......................... 324/754.01, 755.07; 369/126
 See application file for complete search history.

(56) References Cited

U.S. PATENT DOCUMENTS

| 5,276,672 | A  | * | 1/1994  | Miyazaki et al. | 369/126 |
| 5,357,108 | A  | * | 10/1994 | Suzuki et al.   | 850/56  |
| 5,606,162 | A  | * | 2/1997  | Buser et al.    | 850/56  |
| 8,411,550 | B2 | * | 4/2013  | Chou et al.     | 369/126 |
| 2007/0121477 | A1 | * | 5/2007 | Belov et al.    | 369/126 |
| 2008/0237755 | A1 | * | 10/2008 | Chou           | 257/415 |
| 2009/0001486 | A1 | * | 1/2009 | Heck et al.     | 257/415 |
| 2009/0040911 | A1 | * | 2/2009 | Chou et al.     | 369/126 |

\* cited by examiner

*Primary Examiner* — Vinh Nguyen
(74) *Attorney, Agent, or Firm* — Blakely, Sokoloff, Taylor & Zafman LLP

(57) ABSTRACT

A suspended IO trace design for SSP cantilever Read/Write is described. Instead of having the whole I/O trace attached to surface of the cantilever, the cantilever is designed with fishbone-like support and the I/O traces are anchored to cantilever structures 110 at some specific attachment locations with dielectric insulation in between. This design provides very compliant trace compared to cantilever's see-saw actuation around the torsional beam pivot and is also insensitive to residual stress variations from I/O trace in fabrication.

18 Claims, 3 Drawing Sheets

SUSPENDED IO TRACE DESIGN FOR SSP CANTILEVER DATA READ / WRITE

FIELD OF THE INVENTION

Embodiments of the present invention are directed to micro-electromechanical system memories and, more particularly, mechanical cantilevers for to seek-scan probe (SSP) memories.

BACKGROUND INFORMATION

Conventional solid state memories employ microelectronic circuit elements for each memory bit. Since one or more electronic circuit elements are required for each memory bit (e.g., one to four transistors per bit), these devices can consume considerable chip "real estate" to store a bit of information, which limits the density of a memory chip. The primary memory element in these devices is typically a floating gate field effect transistor device that holds a charge on the gate of field effect transistor to store each memory bit. Typical memory applications include dynamic random access memory (DRAM), static random access memory (SRAM), erasable programmable read only memory (EPROM), and electrically erasable programmable read only memory (EEPROM).

A different type of solid state memory commonly known as a phase-change memory uses a phase-change material as the data storage mechanism and offers significant advantages in both cost and performance over conventional memories based on charge storage. Phase change memories use phase change materials—in other words, materials that can be electrically switched between two or more phases having different electrical characteristics such as resistance. One type of memory element, for example, uses a phase change material that can be electrically switched between a generally amorphous phase and a generally crystalline local order, or between different detectable phases of local order across the entire spectrum between completely amorphous and completely crystalline phases.

The phase-change memory can be written to, and read from, by applying current pulses that have the appropriate magnitude and duration and that cause the needed voltages across and current through the volume of phase-change material. A selected cell in a phase-change memory can be programmed into a selected state by raising a cell voltage and a cell current for the selected cell to programming threshold levels that are characteristic of the phase-change material. The voltage and current are then typically lowered to quiescent levels (e.g. essentially zero voltage and current) that are below the programming threshold levels of the phase-change material. This process can be performed by the application of, for example, a reset pulse and a set pulse which can program the cell into two different logic states. In both of these pulses, the cell voltage and cell current are caused to rise at least as high as certain threshold voltage and current levels needed to program the cell.

Next, to read the programmed cell, a read pulse can be applied to measure the relative resistance of the cell material, without changing its phase. Thus, the read pulse typically provides a much smaller magnitude of cell current and cell voltage than either the reset pulse or the set pulse.

A type of phase change memory is the so-called seek-scan probe (SSP) memory which may use a cantilevered probe to read and write to a phase change storage media. In particular, a vertically and laterally actuatable cantilever may be used for SSP memory storage applications. The MEMS mechanical cantilever can be a form of a see-saw like structure with torsional beam acting as pivot for rotational actuation when a voltage is applied on an bottom electrode location under the see-saw cantilever. In order to perform electrical data Read/Write through the cantilever tip with storage media, conductor traces are needed to be connected to cantilever tip and the structure IO pads. Metal traces can usually be fully attached cantilever structure with dielectric in between to obtain full IO trace support.

However, such metal R/W trace on cantilever structure can cause series of issues. First, metal traces on cantilever torsional or in parallel above tosional beam can cause significant actuation change due to R/W trace stress and structure rigidity. Second, metal trace on the cantilever can cause significant cantilever deformation and bending due to stress bimorph effect between metal and cantilever. In addition, metal traces on electrically grounded cantilever are expected to have large parasitic capacitance coupling, which degrades the data reading sensitivity.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
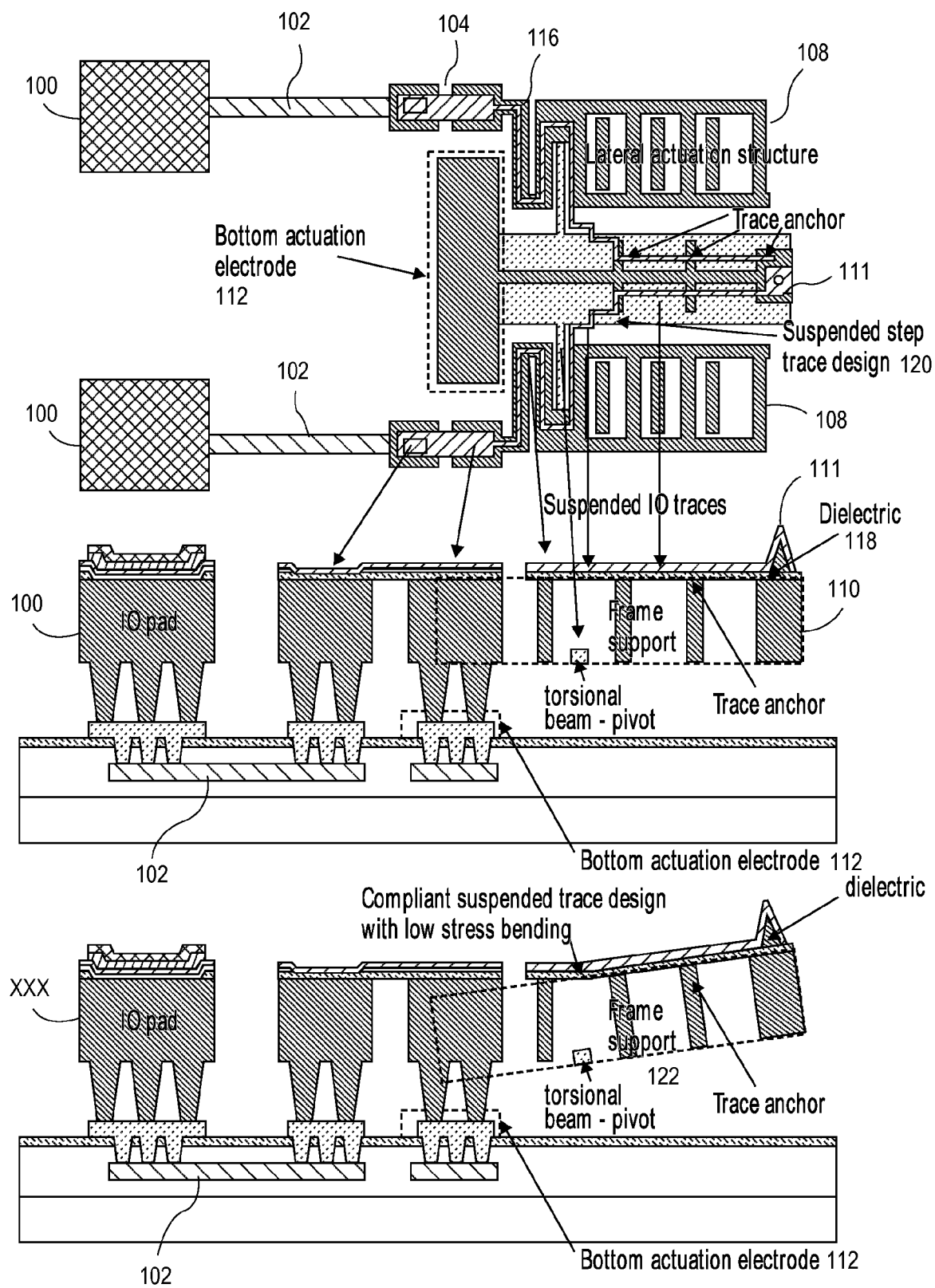
FIG. 1 is a top and side views of an SSP cantilever with suspended read/Write I/O trace design.

FIG. 1 illustrates the one embodiment of a suspended IO trace design for SSP cantilever Read/Write including a top view and side view, as well as a side view showing the vertical actuation. As shown in FIG. 1, the I/O pads 100 are electrically connected by conductors 102 to coupling points 104 to a lateral actuation structure 108. The cantilever arm 110, including the probe 111 is adjacent to a lateral actuation structure 108. Between the I/O pads 100 and the lateral actuation structure is the bottom actuation electrode 112. Instead of having the whole IO trace 116 attached to surface of the cantilever 110, the cantilever 110 is designed with fish-bone-like support and the IO traces 116 are anchored to cantilever structures 110 at some specific attachment locations with dielectric insulation 118 in between. Most of the IO traces 116 are suspended above or between the cantilever 110 and lateral actuation structure 108. The IO traces 102 can be attached to the more rigid support beams of lateral actuation structure 108 as shown in FIG. 1. The traces 102 may be partially attached to the support if needed.

Between the cantilever 110 and lateral actuation structure 108, a suspended step-trace design 120 is used. The design provides very compliant trace compared to cantilever's see-saw actuation around the torsional beam pivot 122 and is also insensitive to residual stress variations from IO trace in fabrication. When the cantilever 110 is vertically actuated, the see-saw cantilever can still rotate around the torsional beam 122 with minimum voltage change due to the compliant step-trace design. With proper trace anchor locations, the step-trace design between cantilever 110 and suspension structure also significantly prevents sever IO trace curving by its own internal material stress gradient from process fabrication. The remaining traces on cantilever to tip 111 are also mostly suspended with a few small anchor locations to provide proper trace attachment to cantilever 110.

When different stress change of IO trace due to process or temperature, the suspended traces are allowed to deform slight and release stress moment without significant impact to cantilever structure. As a result, the stress difference and temperature bimorph deform effect between cantilever 110 and IO traces are significantly reduced compared to fully anchored IO traces on cantilever structure. Therefore, the cantilever deformation variation due metal trace stress and temperature is expected to be greatly reduced with such invented design. Meanwhile, since most of IO traces are suspended in air, the trace parasitic capacitance is also drastically reduced, which in turns improve the data reading sensitivity.

Figure 2:
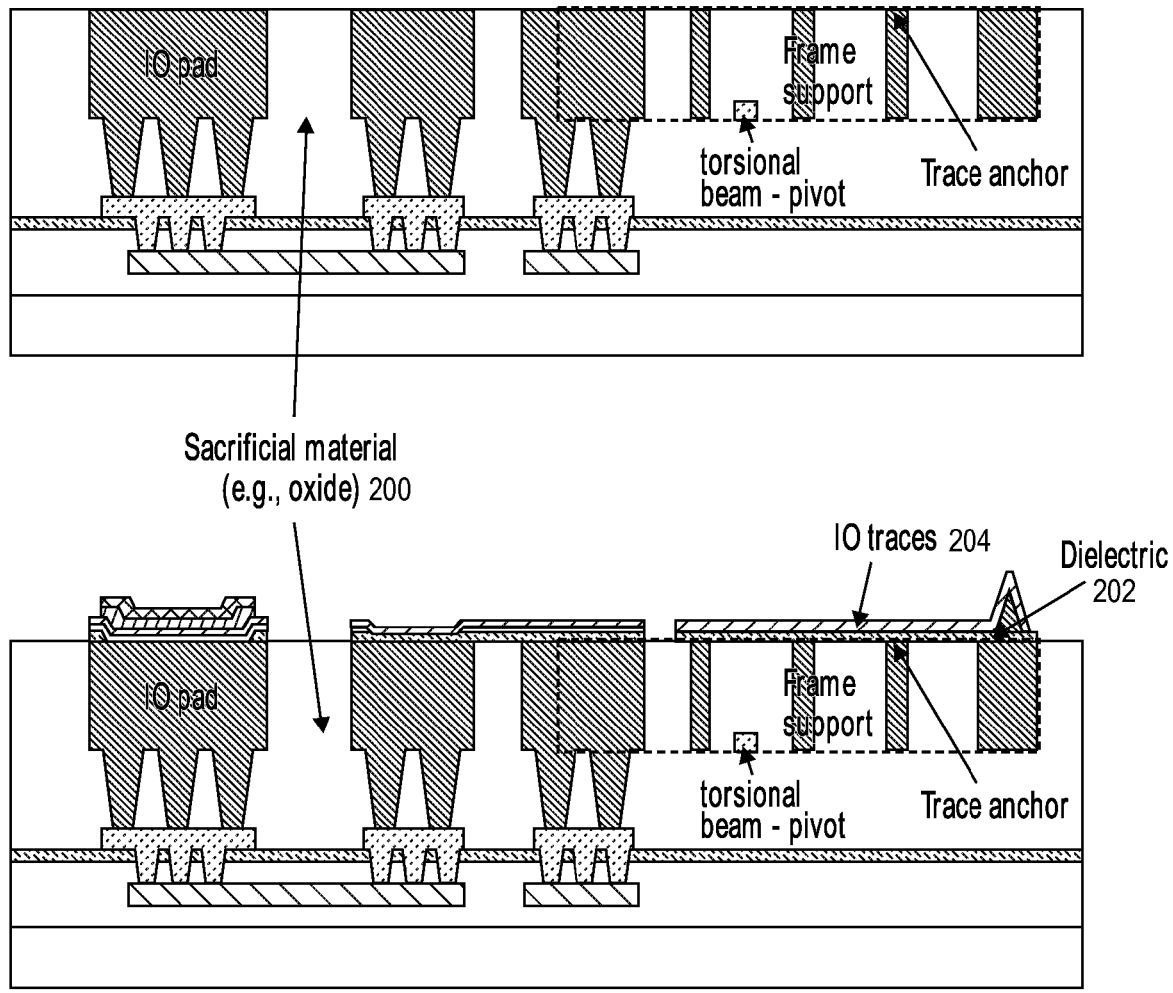
FIG. 2 is a diagram showing fabrication of the SSP cantilever as shown in FIG. 1.

Referring now to FIG. 2, in order to fabricate suspended IO trace in SSP cantilever, a sacrificial material 200 (e.g., oxide) may be deposited to planarize the wafer surface as shown. Dielectric 202 and metal trace 204 may then be deposited and patterned to form desired trace shape. A final release process by removing the sacrificial material is then performed to achieve suspended IO trace on cantilever as shown in FIG. 1.

Figure 3:
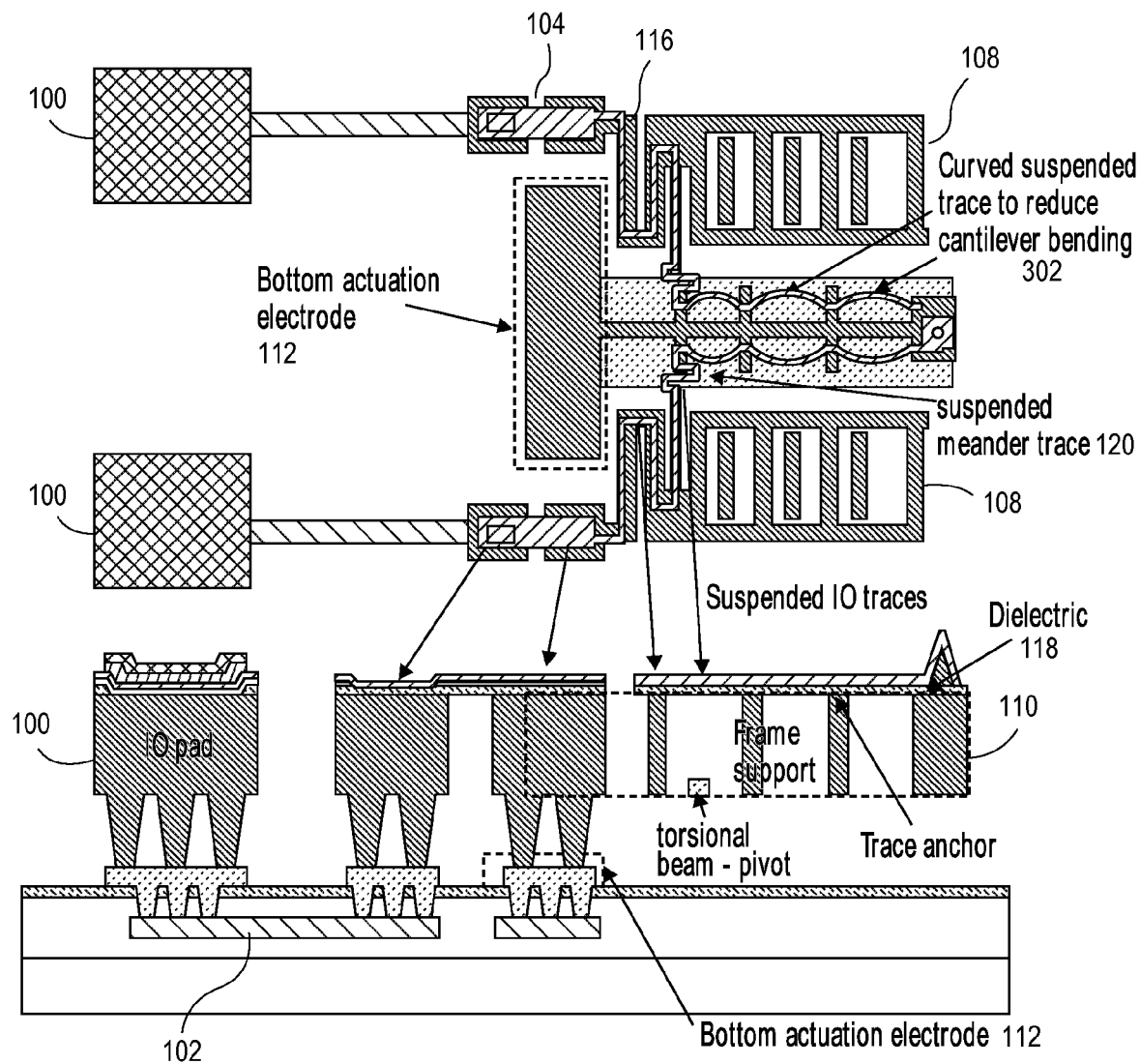
FIG. 3 is an alternative suspended read/Write I/O trace design.

FIG. 3 illustrates an alternative suspended IO trace design in this invention. Like items are labeled with the same reference numeral as in FIGS. 1 and 2. The step-trace design above torsional beam region is replaced by meander-trace design 300 and the straight suspended trace on cantilever structure 110 can be replaced by curve-shape 302 or meander trace design as well. In this alternative design, the trace is expected to be even more compliant and product less impact to cantilever actuation voltage and structure deformation due to stress or temperature change. However, such suspended trace design is more sensitive to IO trace curving itself due to internal stress gradient, especially at suspended meander trace region. With proper dimension design and optimization, stress gradient curving of IO trace can be minimized while providing slight impact to cantilever actuation voltage and structure deformation.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A seek-scan probe, comprising:
   a pair of lateral actuation structures;
   a cantilever structure having a probe tip on its terminal end and attached to a bottom actuation electrode at its opposite end;
   a pair of input/output (I/O) pads electrically connected to traces on corresponding ones of the lateral actuation structures; and
   the traces suspended from the pair of lateral actuation structures, to the cantilever structure, and over a dielectric layer connecting to the probe tip.

2. The seek-scan probe as recited in claim 1 wherein the traces on the cantilever structure comprise a step trace design pattern.

3. The seek-scan probe as recited in claim 1 wherein the traces on the cantilever structure comprise a curved suspended trace design pattern.

4. The seek-scan probe as recited in claim 1 further comprising a torsional beam pivot for the cantilevered structure.

5. The seek-scan probe as recited in claim 1 further comprising frame supports for the lateral actuation structures.

6. The seek-scan probe as recited in claim 1 further comprising trace anchors to anchor the trace to the cantilevered structure.

7. A method, comprising:
   providing a pair of lateral actuation structures;
   providing a cantilever structure having a probe tip on its terminal end and attached to a bottom actuation electrode at its opposite end;
   providing a pair of input/output (I/O) pads electrically connected to traces on corresponding ones of the lateral actuation structures; and
   suspending the traces from the pair of lateral actuation structures to the cantilever structure, and over a dielectric layer connecting to the probe tip.

8. The method as recited in claim 7 further comprising providing traces on the cantilever structure, wherein the traces on the cantilever structure comprise a step trace design pattern.

9. The method as recited in claim 7 further comprising providing traces on the cantilever structure, wherein the traces on the cantilever structure comprise a curved suspended trace design pattern.

10. The method as recited in claim 7 further comprising providii a torsional beam pivot for the cantilevered structure.

11. The method as recited in claim 7 further comprising providing frame supports for the lateral actuation structures.

12. The method as recited in claim 7 further comprising providing trace anchors to anchor the trace to the cantilevered structure.

13. A seek-scan probe, comprising:
   a pair of lateral actuation structures;
   a cantilever structure having a probe tip on its terminal end and attached to a bottom actuation electrode at its opposite end; and
   a pair of input/output (I/O) pads electrically connected to a pair of traces on the pair of lateral actuation structures, wherein the traces are: (1) suspended from the pair of lateral actuation structures, (2) anchored to the cantilever structure at locations over, a dielectric layer, and (3) connected to the probe tip.

14. The seek-scan probe as recited in claim 13 further comprising traces on the cantilever structure having a step trace design pattern.

15. The seek-scan probe as recited in claim 13 further comprising traces on the cantilever structure having a curved suspended trace design pattern.

16. The seek-scan probe as recited in claim 13 further comprising a torsional beam pivot for the cantilevered structure.

17. The seek-scan probe as recited in claim 13 further comprising frame supports for the lateral actuation structures.

18. The seek-scan probe as recited in claim 13 further comprising trace anchors to anchor the trace to the cantilevered structure.

\* \* \* \* \*

UNITED STATES PATENT AND TRADEMARK OFFICE
CERTIFICATE OF CORRECTION

| | |
|---|---|
| PATENT NO. | : 8,624,616 B2 |
| APPLICATION NO. | : 12/165656 |
| DATED | : January 7, 2014 |
| INVENTOR(S) | : Chou et al. |

It is certified that error appears in the above-identified patent and that said Letters Patent is hereby corrected as shown below:

In the Claims

In column 4, at line 48 delete, "providii" and insert --providing--.

Signed and Sealed this
First Day of April, 2014

Michelle K. Lee
*Deputy Director of the United States Patent and Trademark Office*